United States Patent
Burton et al.

(10) Patent No.: US 10,373,645 B2
(45) Date of Patent: Aug. 6, 2019

(54) DATA STORAGE DEVICE DYNAMICALLY GENERATING EXTENDED REDUNDANCY OVER INTERLEAVES OF A DATA TRACK

(71) Applicant: Western Digital Technologies, Inc., San Jose, CA (US)

(72) Inventors: Derrick E. Burton, Ladera Ranch, CA (US); Weldon M. Hanson, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 110 days.

(21) Appl. No.: 15/816,165

(22) Filed: Nov. 17, 2017

(65) Prior Publication Data
US 2019/0156861 A1 May 23, 2019

(51) Int. Cl.
*H03M 13/00* (2006.01)
*G11B 20/18* (2006.01)
*H03M 13/29* (2006.01)

(52) U.S. Cl.
CPC ..... *G11B 20/1833* (2013.01); *H03M 13/2906* (2013.01)

(58) Field of Classification Search
CPC .................. G11B 20/1833; H03M 13/2906
See application file for complete search history.

(56) References Cited

U.S. PATENT DOCUMENTS

| | | | | |
|---|---|---|---|---|
| 5,276,564 A | * | 1/1994 | Hessing | G11B 19/02 360/49 |
| 5,369,345 A | * | 11/1994 | Phan | G05B 13/042 318/561 |
| 5,418,657 A | * | 5/1995 | Machado | G11B 20/1426 360/40 |
| 5,818,654 A | * | 10/1998 | Reddy | G11B 20/1883 360/53 |
| 5,852,524 A | * | 12/1998 | Glover | G11B 5/588 360/51 |
| 5,901,010 A | * | 5/1999 | Glover | G11B 5/588 360/294.5 |
| 6,295,176 B1 | * | 9/2001 | Reddy | G11B 20/1883 360/48 |
| 6,747,827 B1 | | 6/2004 | Bassett et al. | |
| 7,340,665 B2 | * | 3/2008 | Tsang | H03M 13/2906 714/766 |
| 8,255,774 B2 | | 8/2012 | Dixon | |
| 8,296,625 B2 | | 10/2012 | Diggs et al. | |
| 8,856,618 B2 | | 10/2014 | Akiyama et al. | |

(Continued)

*Primary Examiner* — Esaw T Abraham

(57) ABSTRACT

A data storage device is disclosed wherein a first codeword is generated comprising first redundancy, and a second codeword is generated comprising second redundancy. At least part of the first codeword is written to a first data sector and a second data sector of a first data track on a disk, and at least part of the second codeword is written to a third data sector and a fourth data sector of the first data track different from the first data sector and the second data sector. When an anomaly is detected in the first data sector, first extended redundancy is generated over at least the first data sector and the second data sector of the first data track without generating second extended redundancy over the third data sector and the fourth data sector. Data is recovered from the first data sector based on the first extended redundancy.

20 Claims, 6 Drawing Sheets

(56) References Cited

U.S. PATENT DOCUMENTS

| | | |
|---|---|---|
| 8,977,804 B1 | 3/2015 | Horn |
| 9,229,813 B2 * | 1/2016 | Chatradhi et al. |
| 9,348,695 B2 * | 5/2016 | Sharon .................. G11C 29/52 |
| 9,734,009 B2 * | 8/2017 | Hu ...................... G06F 11/1068 |
| 2015/0128008 A1 | 5/2015 | Chatradhi et al. |
| 2017/0147438 A1 | 5/2017 | Wu et al. |

* cited by examiner

US 10,373,645 B2

DATA STORAGE DEVICE DYNAMICALLY GENERATING EXTENDED REDUNDANCY OVER INTERLEAVES OF A DATA TRACK

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

DETAILED DESCRIPTION

Figure 2A:
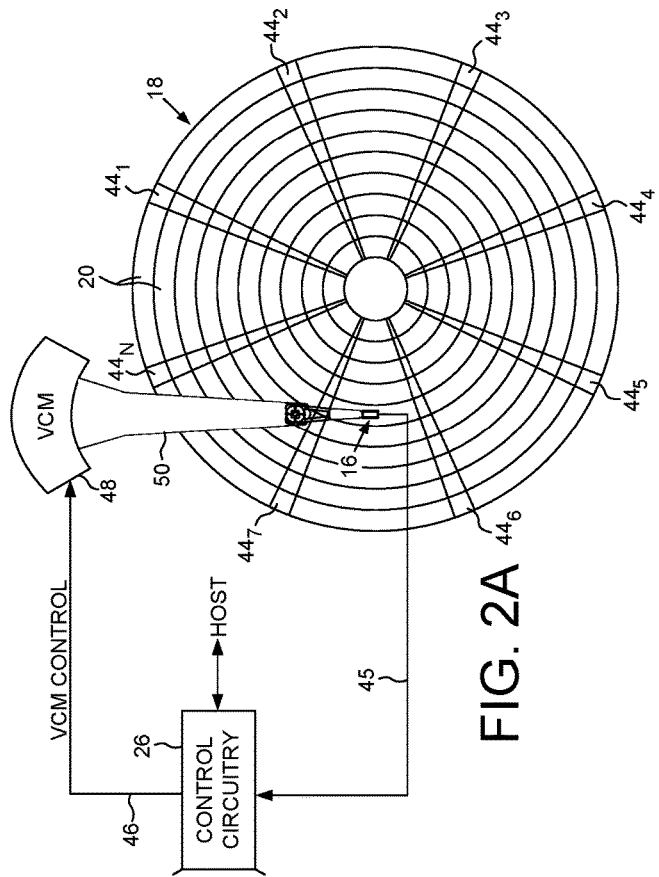
FIG. 2A shows a data storage device in the form of a disk drive according to an embodiment comprising a head actuated over a disk.
Figure 2B:
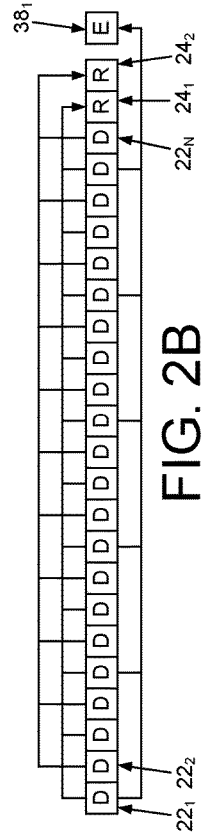
FIG. 2B shows an embodiment wherein the data sectors of a data track form two interleaved codewords, including a first interleave codeword and a second interleave codeword.
Figure 2C:
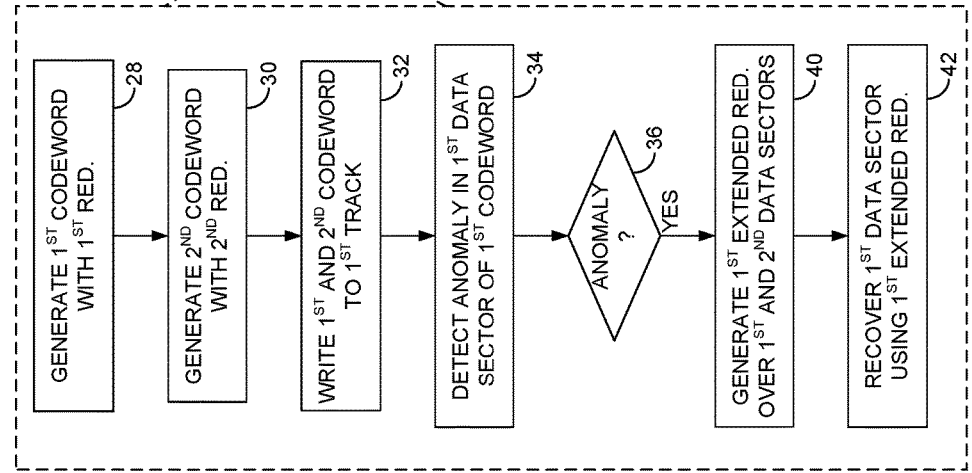
FIG. 2C is a flow diagram according to an embodiment wherein when an anomaly is detected in a first data sector of the first interleave, first extended redundancy is generated over at least the first data sector and a second data sector of the first data track without generating second extended redundancy over a third data sector and a fourth data sector of the second interleave.

FIG. 2A shows a data storage device in the form of a disk drive according to an embodiment comprising a head 16 actuated over a disk 18, wherein the disk 18 comprises a plurality of data tracks 20 and each data track comprises a plurality of data sectors $22_1$-$22_N$ (FIG. 2B). The disk drive further comprises control circuitry 26 configured to execute the flow diagram of FIG. 2C, wherein a first codeword comprising first redundancy $24_1$ is generated (block 28), and a second codeword comprising second redundancy $24_2$ is generated (block 30). At least part of the first codeword is written to a first data sector and a second data sector of a first data track, and at least part of the second codeword is written to a third data sector and a fourth data sector of the first data track different from the first data sector and the second data sector (block 32). An anomaly is detected in at least the first data sector of the first data track (block 34), and when the anomaly is detected in the first data sector (block 36), first extended redundancy $38_1$ is generated over at least the first data sector and the second data sector of the first data track without generating second extended redundancy over the third data sector and the fourth data sector (block 40). Data from the first data sector is recovered based on the first extended redundancy (block 42).

Figure 1:
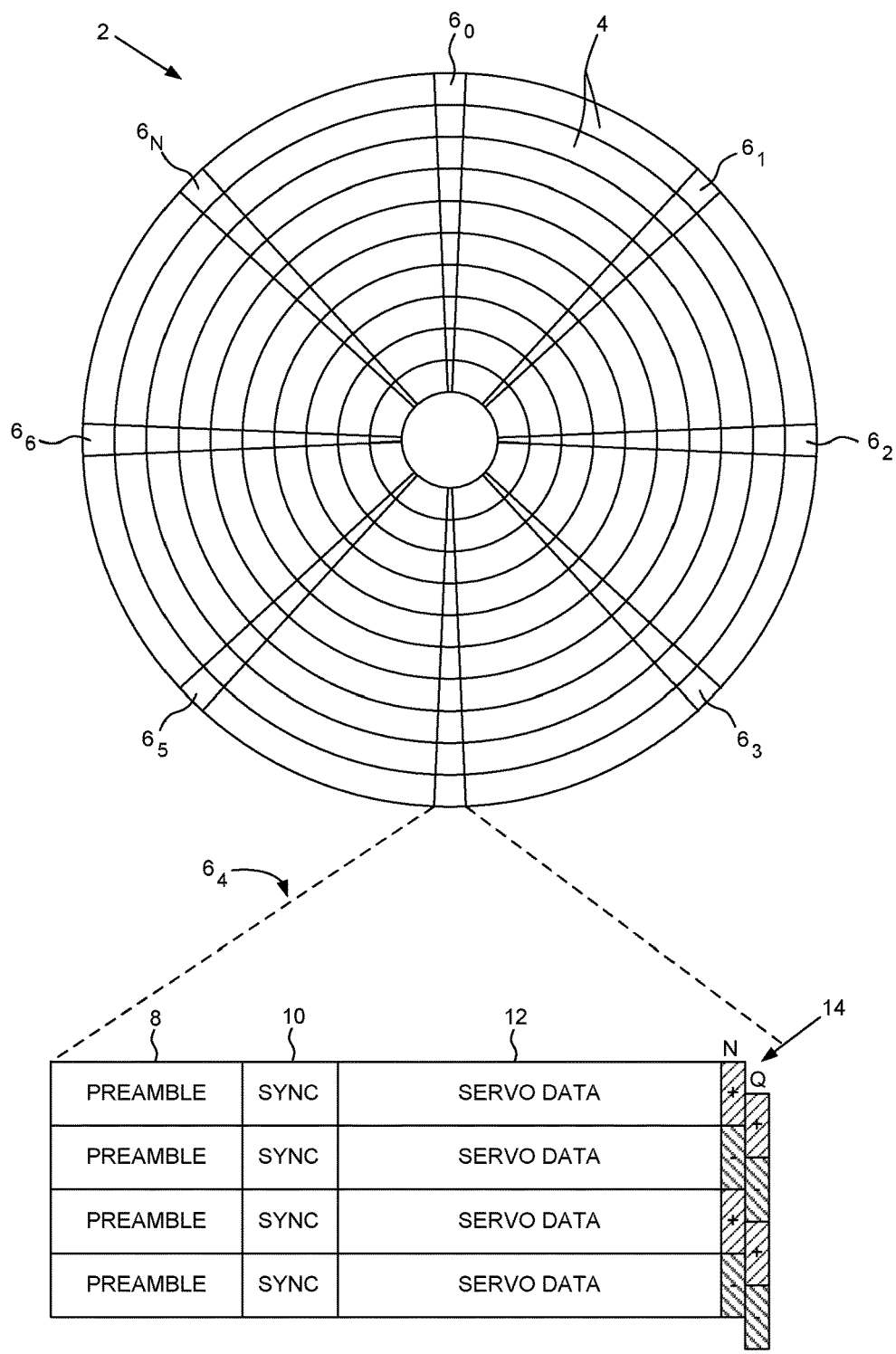
FIG. 1 shows a prior art disk format comprising a plurality of servo tracks defined by servo sectors.

In the embodiment of FIG. 2A, the disk 18 comprises a plurality of servo sectors $44_1$-$44_N$ that define servo tracks, wherein the servo sectors $44_1$-$44_N$ may comprise any suitable head position information, such as a track address for coarse positioning and servo bursts for fine positioning. The data tracks 20 are defined relative to the servo tracks at the same or different radial density. The control circuitry 26 processes a read signal 45 emanating from the head 16 to demodulate the servo sectors $44_1$-$44_N$ and generate a position error signal (PES) representing an error between the actual position of the first head and a reference position relative to a target track. A servo control system in the control circuitry 26 filters the PES using a suitable compensation filter to generate a control signal 46 applied to a voice coil motor (VCM) 48 which rotates an actuator arm 50 about a pivot in order to actuate the head 16 radially over the disk 18 in a direction that reduces the PES. The servo bursts may comprise any suitable pattern, such as an amplitude based servo pattern or a phase based servo pattern (FIG. 1).

Figure 3A:
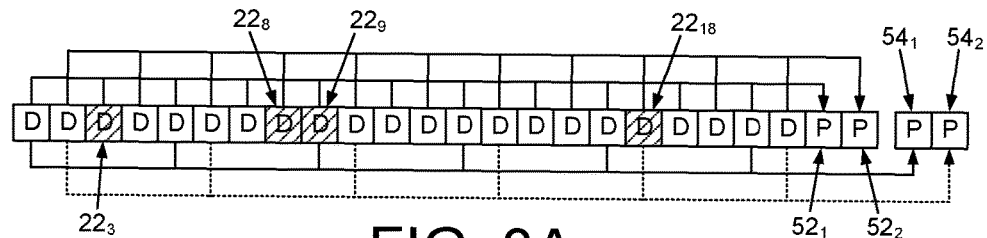
FIG. 3A shows an embodiment wherein the redundancy of each interleaved codeword as well as the extended redundancy comprise at least one parity sector which together are capable of recovering two data sectors per interleave that are unrecoverable at the sector level.

In one embodiment, each data sector $22_1$-$22_N$ in the data track of FIG. 2B may comprise any suitable sector level redundancy used to recover the data sector, such as redundancy for implementing a suitable block code or a suitable iterative code (e.g., a low-density parity check (LDPC) code). In some cases, a data sector may become unrecoverable using the sector-level redundancy, for example, due to extensive media defects or due to track squeeze from an adjacent data track. When a data sector is unrecoverable at the sector level, track-level redundancy may be employed to recover the data sector. An example of track-level redundancy is a parity sector generated over an interleave of the data sectors, wherein the data sectors and parity sectors form a codeword. In an example embodiment shown in FIG. 3A, the odd and even interleaves of data sectors are encoded to generate corresponding track level parity sectors $52_1$ and $52_2$. When a data sector in one of the interleaves is unrecoverable (e.g., data sector $22_3$), the other data sectors of the interleave together with the parity sector can be used to recover the unrecoverable data sector. In this embodiment, the track level parity sectors $52_1$ and $52_2$ are capable of recovering a single data sector per interleave. In order to increase the track level recovery power, in one embodiment extended redundancy may be generated over the data sectors of a track to enable the recovery of more than a single data sector per interleave. In the example of FIG. 3A, the extended redundancy comprises an additional parity sector $54_1$ and $54_2$ per interleave, where each extended parity sector $54_1$ and $54_2$ is generated over a subset of the data sectors in an interleave. Each extended parity sector $54_1$ and $54_2$ enables the recovery of an additional data sector per interleave. In the example of FIG. 3A, the extended parity sector $54_1$ may be used to recover data sector $22_9$ since it is the only unrecoverable data sector of the corresponding codeword. After data sector $22_9$ is recovered, data sector $22_3$ may be recovered using parity sector $52_1$ since it becomes the only unrecoverable data sector of the corresponding codeword. Similarly, extended parity sector $54_2$ may be used to recover data sector $22_{18}$, and then parity sector $52_2$ may be used to recover data sector $22_8$. Other embodiments may employ further levels of extended parity sectors generated over reduced resolutions of data sectors per interleave to further increase the correction power of each interleave. In one embodiment, multiple levels of extended parity sectors may be generated during an access operation, but fewer than all of the extended parity sectors may be stored depending on the number of anomalous data sectors detected during the access operation. In yet other embodiments, more than two first level parity sectors 52 may be generated each corresponding to a different interleave of data sectors which increases the recovery power of the parity sectors, but decreases the format efficiency of the disk.

Figure 3B:
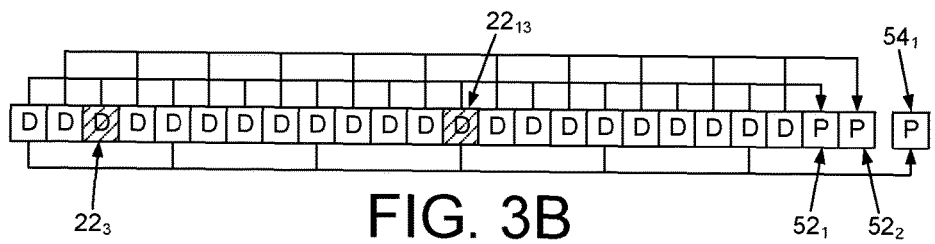
FIG. 3B shows an embodiment wherein the first extended parity sector is generated over data sectors of the first interleave when an anomaly is detected in at least one data sector of the first interleave without generating the second extended redundancy over data sectors of the second interleave.

In one embodiment, the control circuitry is configured to detect an anomaly in a data sector and generate extended redundancy (e.g., a parity sector) for the corresponding interleave when the anomaly is detected. FIG. 3B shows an example of this embodiment wherein the control circuitry may detect an anomaly in a first data sector $22_3$ and detect an anomaly in a second data sector $22_{13}$, both of which are in the first interleave (the odd interleave). The anomalies may be detected during a write operation or a read operation, but in either case, the extended redundancy (e.g. parity sector $54_1$) is generated for the corresponding interleave in order to increase the recovery power of the interleave. For example if the anomalies are detected during a write operation, the extended redundancy may be generated for the corresponding interleave and later used to recover the affected data sectors in the event the data sectors are unrecoverable. In the example of FIG. 3B, no anomalies are detected in the second interleave (even interleave) and so the extended redundancy (e.g., parity sector $54_2$) is not stored, thereby reducing the amount of extended redundancy stored per data track. Reducing the amount of extended redundancy stored may be particularly useful in an embodiment where the extended redundancy is stored in a non-volatile semiconductor memory (NVSM) such as a Flash memory which typically has less storage capacity. In an embodiment where the extended redundancy is stored on the disk (e.g., in a reserved data track), reducing the amount of extended redundancy per data track may help ensure it can be flushed to the disk as part of a power-fail operation.

Figure 3C:
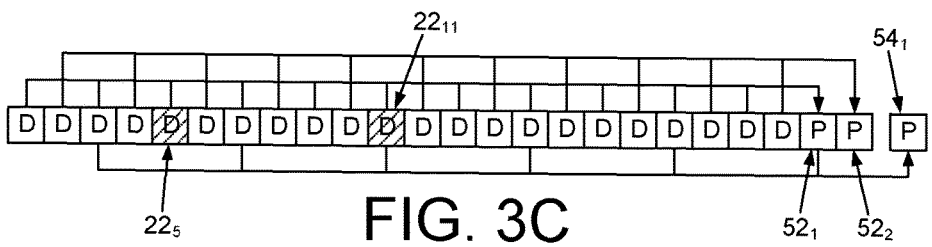
FIG. 3C shows an embodiment wherein the first extended parity sector is generated over a different subset of data sectors in the first interleave depending on where an anomaly is detected within the first interleave.

FIG. 3C shows an embodiment wherein the extended redundancy (e.g. parity sector $54_1$) may be generated over a different subset of data sectors than shown in FIG. 3B depending on which data sector has a detected anomaly. In the example of FIG. 3C, data sector $22_{11}$ has a detected anomaly, and so the extended redundancy (parity sector $54_1$) is generated over a subset of data sectors that includes data sector $22_{11}$. In one embodiment during a write/read operation to the data track, the multiple parity sectors may be generated over multiple different subsets of data sectors within an interleave. For example, a parity sector may be generated over the subset of data sectors shown in FIG. 3B while concurrently generating the parity sector over the subset of data sectors shown in FIG. 3C. At the end of the write/read operation to the data track, the control circuitry may store one of the extended parity sectors depending on which subset an anomalous data sector belongs.

Figure 3D:
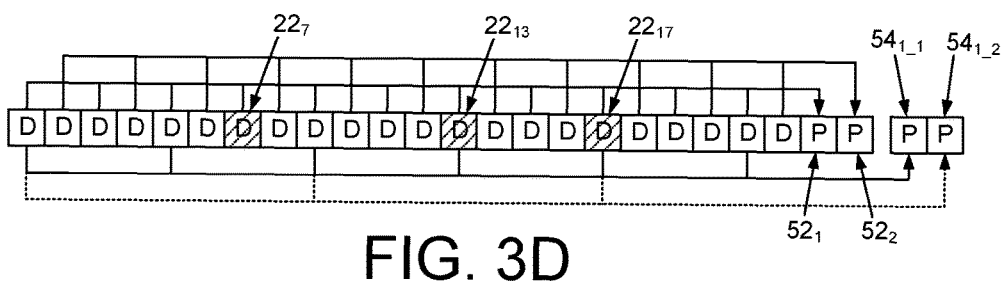
FIG. 3D shows an embodiment wherein the first extended redundancy comprises two parity sectors generated over different subsets of the data sectors in the first interleave to enable recovering three data sectors within the first interleave.

FIG. 3D shows an embodiment wherein the control circuitry may generate and store for an interleave multiple parity sectors with decreasing resolution when more than two anomalous data sectors are detected (e.g., data sectors $22_7$, $22_{13}$, and $22_{17}$ in the odd interleave). Parity sector $54_{1\_2}$ is used to recover data sector $22_{17}$, parity sector $54_{1\_1}$ is then used to recover data sector $22_{13}$, and parity sector $52_1$ is then used to recover data sector $22_7$. Similar to the embodiment of FIG. 3C, in FIG. 3D during a write/read operation the control circuitry may generate multiple levels of extended parity sectors, and then store the minimum number of the extended parity sectors needed based on the number and location of anomalous data sectors detected after the write/read operation finishes.

Figure 3E:
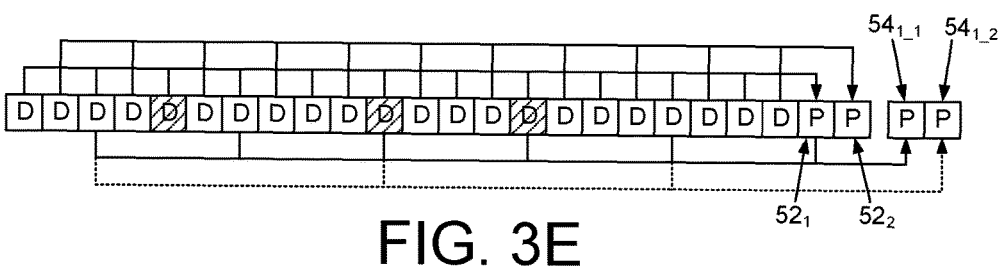
FIG. 3E shows an embodiment wherein the first and second extended parity sectors are generated over different subsets of data sectors in the first interleave depending on where an anomaly is detected within the first interleave.

FIG. 3E shows an embodiment wherein an offset is used when generating the extended parity sectors $54_{1\_1}$ and $54_{1\_2}$ so as to cover different anomalous data sectors within an interleave. In one embodiment, during a write/read operation the control circuitry may generate multiple levels of extended parity sectors as well as extended parity sectors with an offset as shown in FIGS. 3D and 3E, and then store the minimum number of extended parity sectors needed based on the number and location of anomalous data sectors detected after the write/read operation finishes.

Figure 4:
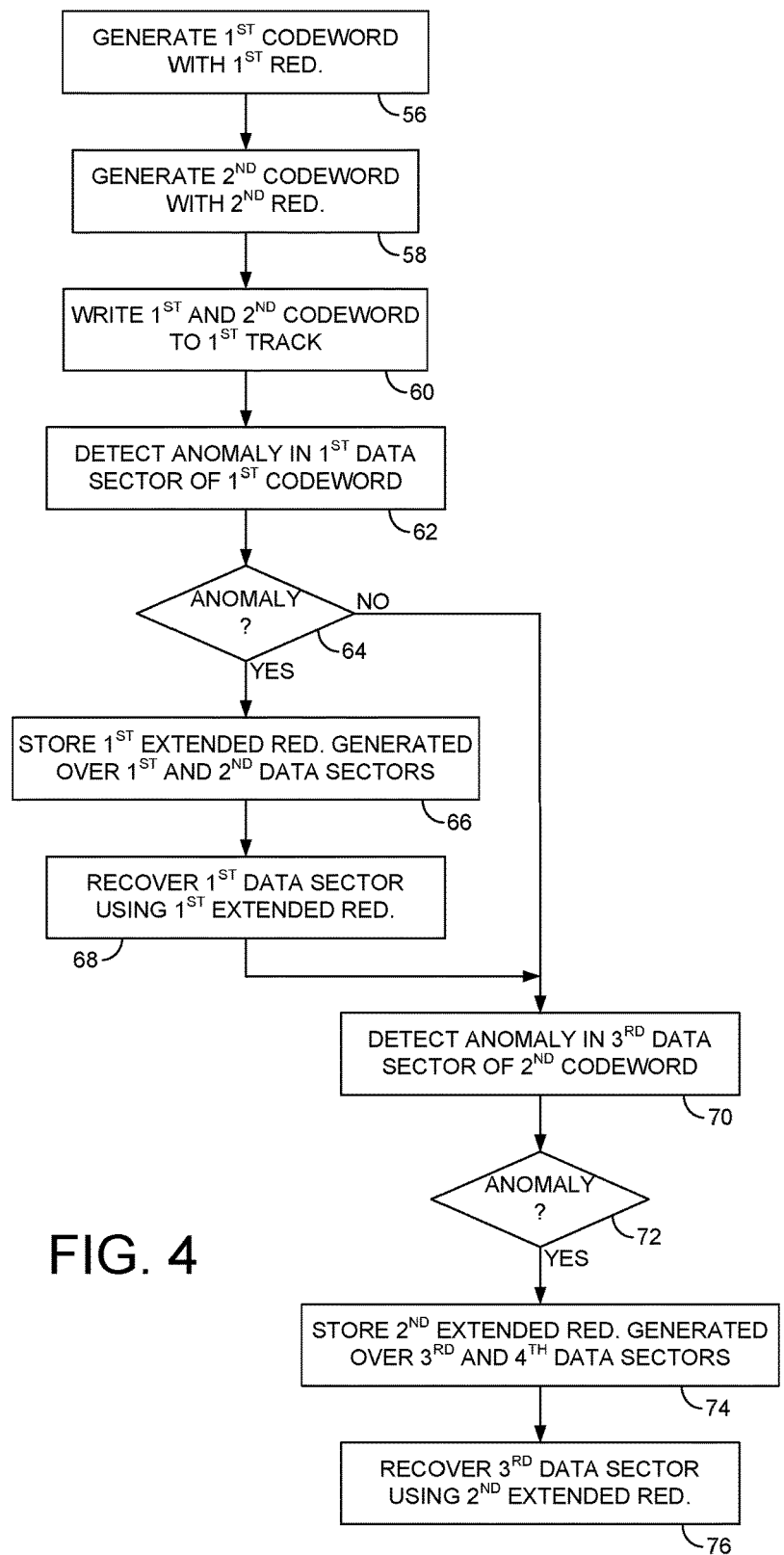
FIG. 4 is a flow diagram according to an embodiment wherein the extended redundancy may be generated for one or both interleaves depending on whether an anomaly is detected in one or both interleaves.

FIG. 4 is a flow diagram according to an embodiment wherein first and second data sectors of a first interleave are encoded into a first codeword (block 56), and third and fourth data sectors of a second interleave are encoded into a second codeword (block 58). The first and second codewords are written to a first track (block 60). If during a write/read operation (block 62) an anomaly is detected in the first data sector of the first interleave (block 64), first extended redundancy is stored that was generated over at least the first and second data sectors of the first interleave (block 66). During a subsequent read operation, if the first data sector is unrecoverable at the sector level, the first data sector is recovered using the first extended redundancy (block 68). If during a write/read operation (block 70) an anomaly is detected in the third data sector of the second interleave (block 72), second extended redundancy is stored that was generated over at least the third and fourth data sectors of the second interleave (block 74). During a subsequent read operation, if the second data sector is unrecoverable at the sector level, the second data sector is recovered using the second extended redundancy (block 76). Accordingly in this embodiment, the extended redundancy is generated and stored for the codewords (interleaves) where an anomaly is detected and therefore benefit from having extended redundancy, and not generated and stored for the codewords (interleaves) where an anomaly is not detected and therefore not benefit from having extended redundancy.

Figures 5A, 5B:
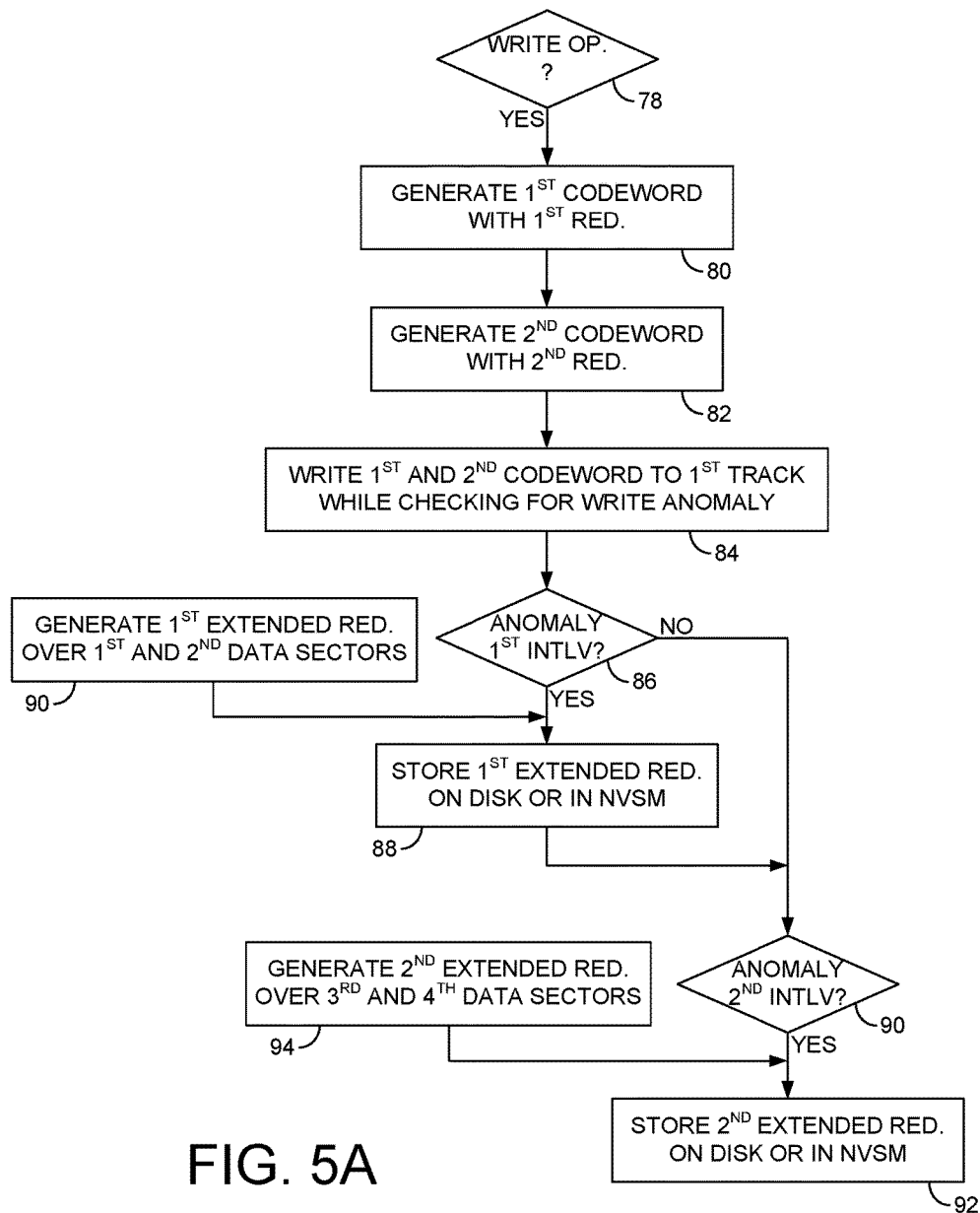
FIG. 5A is a flow diagram according to an embodiment wherein an anomaly is detected in a data sector during a write operation, such as by evaluating a PES generated while writing the data sectors.
FIG. 5B shows an embodiment wherein different frequency preambles are written in data sectors in adjacent data tracks to facilitate generating the PES per data sector.

FIG. 5A is a flow diagram according to an embodiment wherein during a write operation (block 78) a first codeword is generated over a first interleave of data sectors (block 80), wherein the first codeword comprises first redundancy (e.g., a parity sector), and a second codeword is generated over a second interleave of data sectors (block 82), wherein the second codeword comprises second redundancy (e.g., a parity sector). The first and second codewords are written to a first track while checking for write anomalies. If a write anomaly is detected in a data sector of the first interleave (block 86), first extended redundancy (e.g., a parity sector) generated over a subset of the first interleave is stored on the disk or in a NVSM (block 88). The first extended redundancy may be generated at any suitable time (block 90), such as during the write operation at block 84, or after a write anomaly is detected at block 86. In one embodiment described above, during the write operation multiple extended redundancy (e.g., multiple parity sectors) may be generated over varying subsets of the interleaved data sectors. When an anomaly is detected in a particular data sector at block 86, the corresponding extended parity sector(s) are stored at block 88 so they may be used during a subsequent read operation to recover the data sector if needed. Similar operations are executed for the second interleave of data sectors at blocks 90, 92 and 94 of FIG. 5A.

A write anomaly may be detected at blocks 86 and 90 of FIG. 5A in any suitable manner, such as by monitoring a suitable shock sensor (e.g., a piezoelectric element) or by evaluating the PES generated when reading the servo sectors. In another embodiment shown in FIG. 5B, a PES for the head may be generated for each data sector by evaluating a frequency component of the sector preamble field. In this embodiment, the sector preamble for data sectors of adjacent data tracks may be recorded at different frequencies such that the corresponding frequency components of the read signal may be evaluated to generate a PES at a data sector sample rate (as compared to a servo sector sample rate). In one embodiment, the PES may be evaluated for a current data sector being written to a current data track in order to generate and store extended redundancy for the data sector when needed (when an anomaly is detected). In another embodiment, the PES may be evaluated while writing a current data sector to a current data track in order to detect a track squeeze anomaly for the data sector previously written in the adjacent data track while writing the data tracks in a shingled format (shingled magnetic recording (SMR)). In one embodiment, the sector data for each data sector of the previously written data track may be saved so that the extended redundancy can be generated when an anomaly such as track squeeze is detected while writing a current data track. In another embodiment, the extended redundancy may be generated for each interleave of a previously written data track while writing that data track, and then the corresponding extended redundancy stored if an anomaly is detected while writing to a current data track. If an anomaly is not detected in an interleave of a previously written data track or the current written data track, the corresponding extended redundancy may be discarded.

Figure 6:
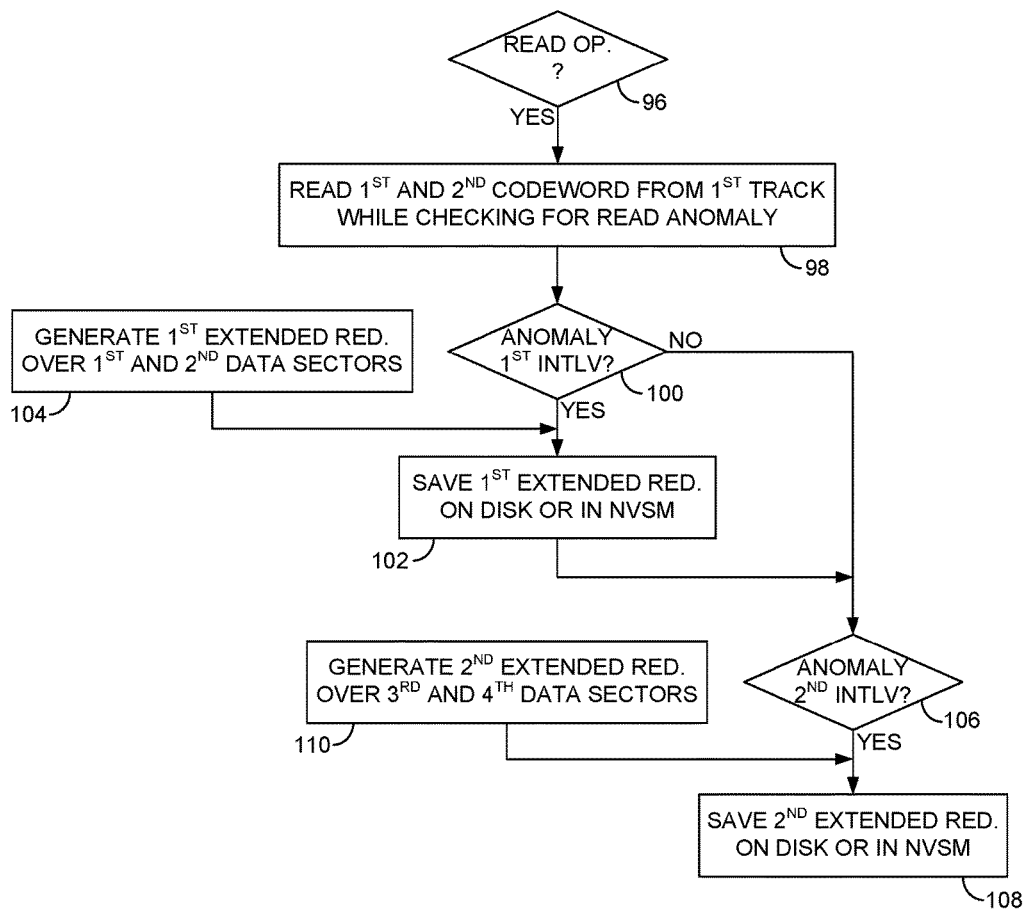
FIG. 6 is a flow diagram according to an embodiment wherein an anomaly is detected in a data sector during a read operation, such as based on a suitable quality metric generated during the read operation.

FIG. 6 is a flow diagram according to an embodiment wherein anomaly in a data sector may be detected during a read operation (block 96). The read operation may be executed for any suitable reason, such as in response to a host read command, or as part of a write-verify operation. For example, in one embodiment when an anomalous data sector is detected during a write operation, instead of storing extended redundancy as part of the write operation the control circuitry may execute a write-verify read of the data sector. In one embodiment, an anomaly in a data sector detected during the read operation may be based on any suitable quality metric, such as a signal-to-noise ratio (SNR) of the read signal, sync mark quality, number of symbol errors detected, number of coding iterations needed to recover the data sector, etc. When an anomalous data sector (marginal data sector) is detected (block 100) while reading the data sectors of a first interleave (block 98), first extended redundancy is stored on the disk or in a NVSM (block 102). The first extended redundancy may be generated at any suitable time (block 104), such as during the read operation at block 98, or after a read anomaly is detected at block 100. In one embodiment described above, during the read operation multiple extended redundancy (e.g., multiple parity sectors) may be generated over varying subsets of the interleaved data sectors. When an anomaly is detected in a particular data sector at block 100, the corresponding extended parity sector(s) are stored at block 102 so they may be used during a subsequent read operation to recover the data sector if needed. If an anomaly is not detected in an interleave of the data track, the corresponding extended redundancy may be discarded. Similar operations are executed for the second interleave of data sectors at blocks 106, 108 and 110 of FIG. 6.

The track-level extended redundancy $38_1$ shown in FIG. 2B may be generated in any suitable manner. In the embodiment where the extended redundancy $38_1$ comprises one or more parity sectors, at least one parity sector may comprise, for example, a hard parity sector may be generated by XORing the user bits in each of a number of block encoded data sectors. An unrecoverable data sector may then be erasure corrected by XORing the parity sector with the recovered data sectors to re-generate the unrecovered data sector.

In another embodiment the track level parity sectors and the extended redundancy parity sectors may be soft parity sectors generated by bit-wise XORing LDPC encoded data sectors. The bit-wise XOR of LDPC code words results in another valid LDPC sector but also relating the bits across the subset of sectors forming additional parity equations. This embodiment allows the sector's LDPC code iterations to be combined with soft parity redundancy of the subset of sectors to allow a separate set of LDPC parity constraints to be applied which are unique relative to the bitwise XOR operations performed to obtain the track's soft parity constraints. This embodiment also allows an additional erasure correction using the encoded media pattern in lieu of executing additional iterations when only one failing sector of the extended redundancy's subset of sectors of the track remains in error which can then aid convergence of the track level parity for aggregate of failed convergent sectors of the full track's soft parity.

In other embodiments, the extended redundancy parity sectors may be generated as both hard and soft parity sectors to extend the protection of data sectors of a track or subset of sectors of a track which may be beneficial to the hardware implementation and code execution.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

In various embodiments, a disk drive may include a magnetic disk drive, an optical disk drive, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
    a disk comprising a plurality of data tracks, where each data track comprises a plurality of data sectors;
    a head actuated over the disk; and
    control circuitry configured to:
        generate a first codeword comprising first redundancy;
        generate a second codeword comprising second redundancy;
        write at least part of the first codeword to a first data sector and a second data sector of a first data track;
        write at least part of the second codeword to a third data sector and a fourth data sector of the first data track different from the first data sector and the second data sector;
        detect an anomaly in at least the first data sector of the first data track;
        when the anomaly is detected in the first data sector, generate first extended redundancy over at least the first data sector and the second data sector of the first data track without generating second extended redundancy over the third data sector and the fourth data sector; and
        recover data from the first data sector based on the first extended redundancy.

2. The data storage device as recited in claim 1, wherein:
    the first data sector and the second data sector form at least part of a first interleave of data sectors in the first data track; and
    the third data sector and the fourth data sector form at least part of a second interleave of data sectors in the first data track.

3. The data storage device as recited in claim 2, wherein the first redundancy comprises at least a first parity sector.

4. The data storage device as recited in claim 2, wherein the first extended redundancy comprises at least a first parity sector.

5. The data storage device as recited in claim 3, wherein:
    the first interleave of data sectors in the first data track comprises a fifth data sector; and
    the first extended redundancy comprises a second parity sector generated over at least the fifth data sector and exclusive of the first data sector.

6. The data storage device as recited in claim 1, wherein the control circuitry is further configured to detect the anomaly in the first data sector based on position information of the head detected while writing at least part of the first codeword to the first data sector.

7. The data storage device as recited in claim 1, wherein the control circuitry is further configured to detect the anomaly in the first data sector based on a quality metric generated while reading the first data sector.

8. The data storage device as recited in claim 1, wherein the control circuitry is further configured to write the first extended redundancy to the disk.

9. The data storage device as recited in claim 1, further comprising a non-volatile semiconductor memory (NVSM), wherein the control circuitry is further configured to store the first extended redundancy in the NVSM.

10. The data storage device as recited in claim 1, wherein the control circuitry is further configured to:

detect an anomaly in at least the third data sector of the first data track; and when the anomaly is detected in the third data sector, generate second extended redundancy over at least the third data sector and the fourth data sector of the first data track; and recover data from the third data sector based on the second extended redundancy.

11. A method of operating a data storage device, the method comprising:

generating a first codeword comprising first redundancy;

generating a second codeword comprising second redundancy;

writing at least part of the first codeword to a first data sector and a second data sector of a first data track on a disk;

writing at least part of the second codeword to a third data sector and a fourth data sector of the first data track different from the first data sector and the second data sector;

detecting an anomaly in at least the first data sector of the first data track;

when the anomaly is detected in the first data sector, generating first extended redundancy over at least the first data sector and the second data sector of the first data track without generating second extended redundancy over the third data sector and the fourth data sector; and recovering data from the first data sector based on the first extended redundancy.

12. The method as recited in claim 11, wherein:

the first data sector and the second data sector form at least part of a first interleave of data sectors in the first data track; and the third data sector and the fourth data sector form at least part of a second interleave of data sectors in the first data track.

13. The method as recited in claim 12, wherein the first redundancy comprises at least a first parity sector.

14. The method as recited in claim 12, wherein the first extended redundancy comprises at least a first parity sector.

15. The method as recited in claim 13, wherein:

the first interleave of data sectors in the first data track comprises a fifth data sector; and the first extended redundancy comprises a second parity sector generated over at least the fifth data sector and exclusive of the first data sector.

16. The method as recited in claim 11, further comprising detecting the anomaly in the first data sector based on position information of a head detected while writing at least part of the first codeword to the first data sector.

17. The method as recited in claim 11, further comprising detecting the anomaly in the first data sector based on a quality metric generated while reading the first data sector.

18. The method as recited in claim 11, further comprising writing the first extended redundancy to the disk.

19. The method as recited in claim 11, further comprising storing the first extended redundancy in a non-volatile semiconductor memory.

20. The method as recited in claim 11, further comprising:

detecting an anomaly in at least the third data sector of the first data track; and when the anomaly is detected in the third data sector, generating second extended redundancy over at least the third data sector and the fourth data sector of the first data track; and recovering data from the third data sector based on the second extended redundancy.

* * * * *